United States Patent [19]

Taddiken et al.

[11] Patent Number: 5,065,132

[45] Date of Patent: Nov. 12, 1991

[54] PROGRAMMABLE RESISTOR AND AN ARRAY OF THE SAME

[75] Inventors: Albert H. Taddiken, McKinney; Han-Tzong Yuan, Dallas; Hisashi Shichijo, Plano, all of Tex.

[73] Assignee: Texas Instruments Incorporated, Dallas, Tex.

[21] Appl. No.: 614,473

[22] Filed: Nov. 16, 1990

[51] Int. Cl.[5] .............................................. H01C 13/00
[52] U.S. Cl. .................................. 338/334; 338/307; 307/201; 357/51
[58] Field of Search ............... 338/334, 306, 308, 195, 338/48, 307; 307/201, 264, 490; 323/354; 364/482; 29/610.1; 437/918; 357/51

[56]  References Cited
U.S. PATENT DOCUMENTS

| | | | |
|---|---|---|---|
| 3,947,701 | 3/1976 | Russell, Jr. ........................... 307/264 |
| 4,016,483 | 4/1977 | Rudin .................................. 323/354 |
| 4,315,239 | 2/1982 | Daniele et al. ...................... 338/308 |
| 4,338,590 | 7/1982 | Connolly, Jr. et al. ......... 338/195 X |
| 4,644,119 | 2/1987 | Ott ...................................... 307/490 |
| 4,668,932 | 5/1987 | Drori et al. ........................... 338/48 |
| 4,849,903 | 7/1989 | Fletcher et al. .................... 364/482 |
| 4,862,136 | 8/1989 | Birkner ............................... 338/195 |
| 4,931,763 | 6/1990 | Ramesham et al. ........... 338/308 X |
| 4,945,257 | 7/1990 | Marrocco, III .................... 307/201 |

Primary Examiner—Marvin M. Lateef
Attorney, Agent, or Firm—Melvin Sharp; James T. Comfort; N. Rhys Merrett

[57] ABSTRACT

A programmable resistor 10 is provided having a resistive element 12. Resistive element 12 includes a substrate 26 formed by a layer of semiconductor of a first conductivity-type. A current path 32 is formed in substrate 26 by a layer of semiconductor of a second conductivity-type. An interface 36 having interfacial traps is formed between current path 32 and substrate 26. A backgate 24 is formed adjacent substrate 26. A first switch 14 selectively couples backgate 24 to a first voltage while a second switch 16 selectively couples backgate 24 to a second voltage.

31 Claims, 2 Drawing Sheets

PROGRAMMABLE RESISTOR AND AN ARRAY OF THE SAME

TECHNICAL FIELD OF THE INVENTION

The present invention relates in general to resistors and more particularly, to programmable resistors and arrays made of such resistors.

BACKGROUND OF THE INVENTION

Programmable resistors can be utilized in a number of analog signal processing applications such as resistive ladders in digital to analog converters and in resistor arrays in neural networks. Neural networks provide a means for solving random problems, such as in sensing systems, which must "learn" the surrounding environment so that it can be categorized by experience. Neural networks solve these sensing problems by expressing the sensor outputs as multi-dimensional vectors and then "learn" the vectors by constructing a matrix by correlation methods.

Neural networks use arrays formed by rows and columns of weighting elements, represented by resistors, to create matrix vectors of voltages input from corresponding sensors using Ohm's law. Operational amplifiers sum the currents resulting from the drop of an input voltage across the resistors in each of the rows. The current output from each row represents the vector product for one component of a corresponding output vector. By storing data in terms of resistor conductance values, an environment can be "learned" and later retrieved by associative recall. Thus, the resistors must change with the system experience to "learn" an environment. Further, neural network systems can optimize the learned patterns of various environments by varying the resistive elements in the network. In general, when used in applications such as adaptive neural networks, the programmable resistors must withstand a large number of programming cycles as data is "learned".

Various means have been devised for providing variable weighting elements in neural networks. Each of these means has been found to have significant disadvantages. For example, circuitry using up-down counters and decoded switches along with fixed resistors could be used to generate the appropriate weights; however, such an approach would be limited to only a small number of weighting elements, thereby limiting the complexity and utility of the network. Electrically-erasable, electrically-programmable read-only memories (EEPROM) provide a second option; however, the limited programming lifetime of these devices make them impractical. Finally, dynamic random-access memories (DRAMs) have been considered, but DRAMs need refreshing after a read operation which greatly increases the number of overhead operations required in the overall scheme of the neural network application.

SUMMARY OF THE INVENTION

According to the invention, a programmable resistor is provided which includes a substrate formed by a layer of semiconductor of a first conductivity-type. A current path region of a second conductivity type is formed in the substrate such that an interface having interfacial traps is formed between the current path and the substrate. A backgate is formed adjacent to the current path. Circuitry is coupled to the backgate for selectively biasing the substrate thereby varying the number of carriers residing in the interfacial traps.

According to other aspects of the invention, the current path comprises the channel area of a field effect transistor. The channel area spaces the source/drains of the field effect transistor and is formed in the substrate so as to create a plurality of interfacial traps along the channel area/substrate interface.

The present invention presents distinct advantages over prior art programmable resistors. The present invention can be implemented with any semiconductor device having a current path which can be controlled by the trapping of charge along a semiconductor interface. Both silicon and gallium arsenide technologies may be used depending on the required operating characteristics, such that the programmable resistor will be compatible with the associated system circuitry. Further, minimal chip area is required for the fabrication of such device due to the simplicity of their structures; the need for up/down counters and a large number of associated fixed resistors has been eliminated. By selectively controlling the number of electrons residing in the traps, the resistance can be varied over a wide-range of value.

BRIEF DESCRIPTION OF THE DRAWINGS

Other aspects of the invention and their advantages will be discerned, when one refers to the following detailed description as taken in conjunction with the drawings, and in which like numbers identify like parts and in which.

DETAILED DESCRIPTION OF THE INVENTION

Figure 1:
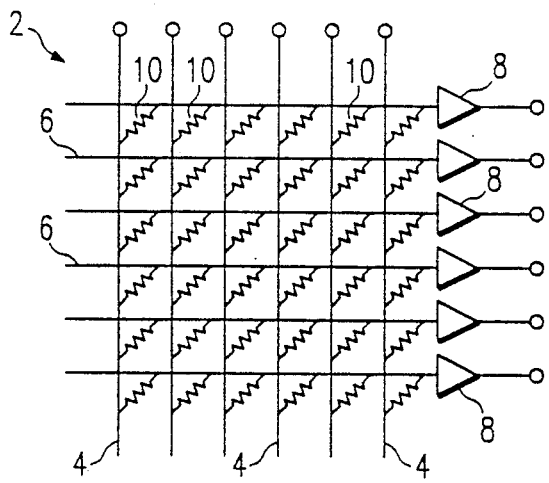
FIG. 1 is a schematic diagram of a neural network using resistive elements according to the invention.

FIG. 1 depicts a neural network 2 formed by columns of input lines 4 and rows of output lines 6. An operational amplifier 8 is provided for each output line 6. A plurality of programmable resistors 10 electrically couple associated output lines 6 with associated input lines 4.

Figure 2:
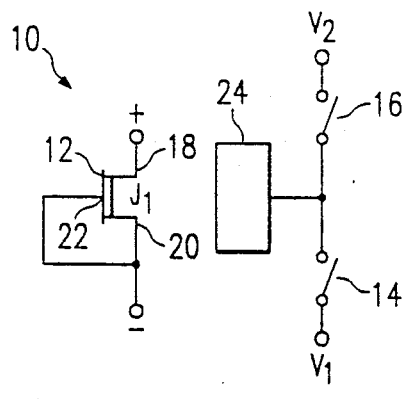
FIG. 2 is a schematic diagram of a programmable resistor according to the invention.

In FIG. 2, a schematic representation is given of a programmable resistor 10 as implemented using a field effect transistor (FET) 12 and a pair of switches 14 and 16. Transistor 12 may be, for example, a metal semiconductor FET (MESFET), a field effect transistor with a floating gate structure or a gateless FET. Switches 14 and 16 are, for example, bipolar or field effect transistors fabricated concurrently with field effect transistor 12 on the same substrate. Transistor 12 provides the resistive element of programmable resistor 10.

During operation of an n channel transistor 12, a positive drain/source voltage $V_{ds}$ is created by applying a positive voltage to drain 18 of FET 12 while source 20 is held at a negative voltage or ground. The gate/source voltage $V_{gs}$ is set to zero by connecting the gate 22 of transistor 12 to source 20. The backgate contact 24 is coupled to a negative voltage $V_1$ through switch 14 and to a positive voltage $V_2$ through switch 16. If transistor 12 is selected to be a p channel device, the voltages are reversed, as known in the art.

Figure 3:
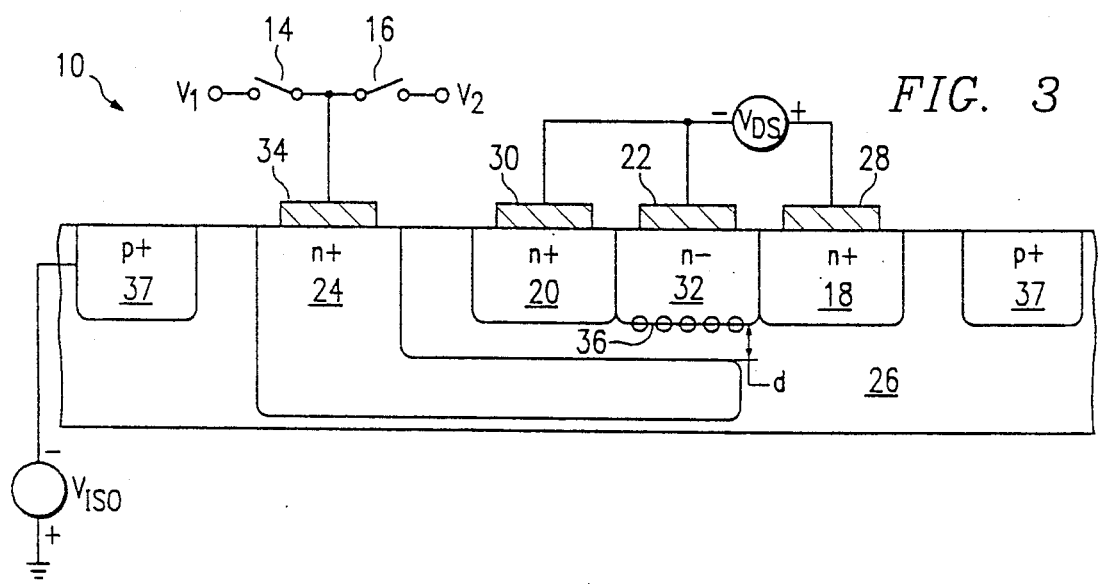
FIG. 3 is an elevational sectional view of a first preferred embodiment according to the present invention.

FIG. 3 depicts a preferred embodiment of the programmable resistor 10 shown in FIG. 1 using a gallium arsenide Metal Semiconductor Field Effect Transistor (MESFET) to provide the variable resistance. Transistor 12 is formed at the face of a semi-insulating gallium arsenide (S.I. GaAs) substrate 26 and includes an n+drain region 18 having an ohmic contact 28 and an n+ source region 20 having an ohmic contact 30. Drain region 18 and source region 20 are spaced by an n channel area 32. Channel area 32 provides a controlled current path for programmable resistor element 10. The conductivity of channel area 32 is controlled by an overlying Schottky gate 22 and a backgate 24. Backgate 24 is formed by an n+region in substrate 12 and is provided with an ohmic contact 34. In alternative embodiments, backgate 24 may be formed by an n−region or by an ohmic contact 34 alone. Backgate 24 is spaced from channel area 32 by a length d. In a preferred embodiment, length d is approximately 500–1000 angstroms. The formation of n−channel area 32 in GaAS substrate 26 creates an interface 36 between them. In a preferred embodiment, a region 37 of p-type material laterally encloses programmable resistor 10. Ring 37 is negatively biased by a voltage $V_{ISO}$ such that resistor 10 is isolated from similar adjacent resistors 10, eliminating the possibility of cross-backgating therebetween. It is important to note that while an n channel device is depicted in FIG. 3, for a p−channel MESFET a similar interface 36 can be used. With the p channel device, the voltages applied must be appropriately inverted, as known in the art, but the overall operation essentially remains the same.

Preferably, backgate 24 is L-shaped such that it extends vertically from the surface of substrate 26 and then horizontally under channel area 32. This structure can be formed by first performing a high energy implant into substrate 26 to form the horizontally extending portion followed by one or more implants of varying energies to form the vertically extending portion of backgate 24. The vertical portion of backgate 24 can be concurrently formed during the implantation of source region 20, and drain region 18 for processing efficiency. After the implantations, an annealing step is performed to repair defects in the substrate crystal resulting from the implantation steps. Besides implantation techniques, L-shaped backgate 24 may be formed by epitaxial growth followed by the formation of an overlying substrate layer by epitaxial growth of another layer of semiconductor material similar to that of substrate 26. The vertical portion of backgate 24 can then be formed by implantation as previously described.

Figure 4:
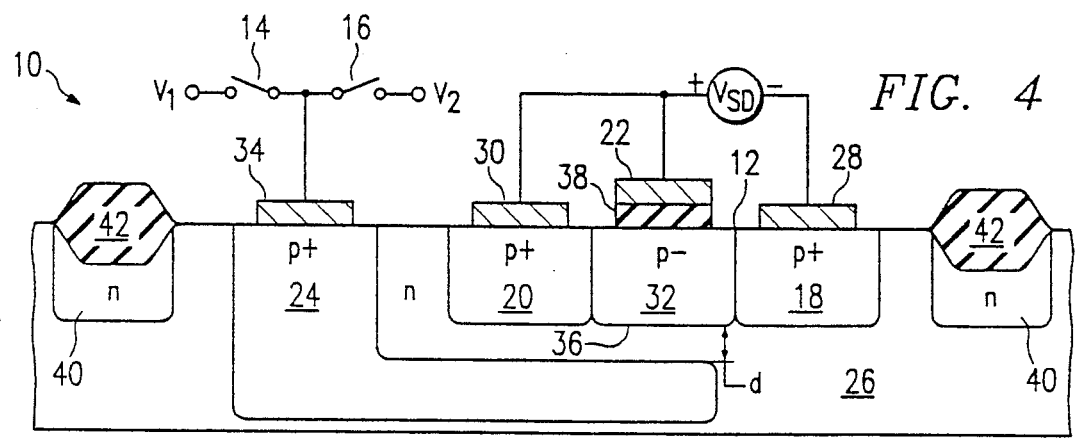
FIG. 4 is an elevational sectional view of a second preferred embodiment according to the invention.

FIG. 4 depicts a second preferred embodiment of the programmable resistor 10 shown in FIG. 1 using a silicon Metal Oxide Semiconductor Field Effect Transistor (MOSFET). In this case, a p channel transistor 12 is formed at the face of a n-type silicon substrate 26 and includes a p+drain region 18 having an ohmic contact 28 and a p+source region 20 having an ohmic contact 30. Drain region 18 and source region 20 are spaced by a p-channel area 32. Channel area 32 is controlled by gate 22 which is insulated from the surface of channel area 32 by a layer of oxide 38. Backgate 24 is formed by a p+region in substrate 26 and is provided with an ohmic contact 34. Backgate 24 is again spaced from source region 20 by a length d, which is preferably on the order of 500–1000 angstroms. The formation of a p channel area 32 in n-type silicon substrate 26 creates an interface 36 between them. In this embodiment, a moat 40 of n-type material and an overlying thick oxide layer 42 surround resistor 10 providing electrical isolation. As in the case of the MESFET depicted in FIG. 3, the conductivity of the substrate 26, source region 20, drain region 18 and backgate 24 can be appropriately reversed as known in the art. For example, MOSFET 12 may be an n channel device formed in a p-type substrate.

Referring to both FIGS. 3 and 4, across interface 36 a number of interfacial traps have been created. These traps, typically EL2 sites in gallium arsenide devices, are an inherent consequence of defects in the lattice created during the crystallization of semiconductor materials. Traps can also be intentionally created using methods known in the art, such as by damaging the lattice by ion implantation, proton implantation, neutron implantation or exposure to radiation. Additionally, traps can be created by epitaxial growth techniques. For MOSFET embodiments, intentional trap creation may be required to achieve a sufficient number of traps for the operations discussed below. For gallium arsenide devices, intentional creation of additional traps will improve the performance of resistor 10 during these operations. Interfacial traps are allowed energy states in which carriers can be localized in areas surrounding interface 36. These allowed states are distributed in the forbidden bandgap between the valence and conduction bands.

Critical to the present invention is the fact that the interfacial traps can be charged or discharged as a function of the bias applied to backgate 24. By applying a negative voltage to backgate 24 of FIG. 3 with respect to the channel (induced in channel area 32 by the application of voltages $V_{gs}$ and $V_{ds}$) by closing switch 14, the height of the barrier preventing electron flow between backgate 24 and interface 36 is reduced. A number of electrons are then transported by diffusion and drift from backgate 24 to the region of the traps. A number of these electrons are then trapped along interface 36. The trapped electrons partially deplete channel area 32 from the backside thereby narrowing the channel and thus increasing the channel resistance. By pulsing backgate 24 with a selected number of voltage pulses having a selected pulse height, the number of traps being filled can be incremented, which in turn increments the channel resistance. If the temperature of resistor 10 is kept below the temperature at which a substantial number of electrons are thermally emitted from the traps, the selected resistance can be retained, even when the resistance is utilized by passing current between source 20 and drain 18. The same action can be effected on the resistor 10 of FIG. 4 by applying a positive voltage to backgate 24 to induce carrier flow between backgate 24 and interface 36.

Again using the n channel MESFET of FIG. 3 as an example, the operation of emptying traps to reduce channel resistance can now be described. By applying a positive voltage to backgate 24 with respect to the channel (induced in channel area 32 by the application of voltages $V_{gs}$ and $V_{ds}$) by closing switch 16, the width of the potential barrier between the traps and backgate 24 is reduced allowing electrons residing in the traps to tunnel to the region of substrate 26 between the channel and backgate 24. The electrons are then transported by drift and diffusion to backgate 24 emptying a number of the traps. By pulsing backgate 24 with a selected number of voltage pulses having a selected pulse height, the number of traps being emptied can be incremented, which in turn decrements the channel resistance.

In addition to the controlled emptying of the traps as described above, the traps may be completely emptied in a single operation. In the array format, the traps in all of the resistors 10 may be erased in bulk. One method is to raise the temperature of resistor 10 (or the array of resistors 10) so that the electrons residing in the traps are thermally emitted. With a voltage $V_{ds}$ applied between source 20 and drain 18, the electrons will then be swept towards drain 18. A second method is to direct light at the surface of substrate 26. If the wavelength of the light is selected such that the energy is less than the bandgap of the substrate material and greater than or equal to the gap between the traps and the conduction band of the substrate material, the electrons will similarly be emitted from the traps.

A similar process is used to fill and empty the traps in the case of p channel devices. In the case of a p channel device, however, the charge carriers are holes instead of electrons and thus, the voltages applied to source 20, drain 18, gate 22, and backgate 24 must be appropriately reversed.

Figure 5:
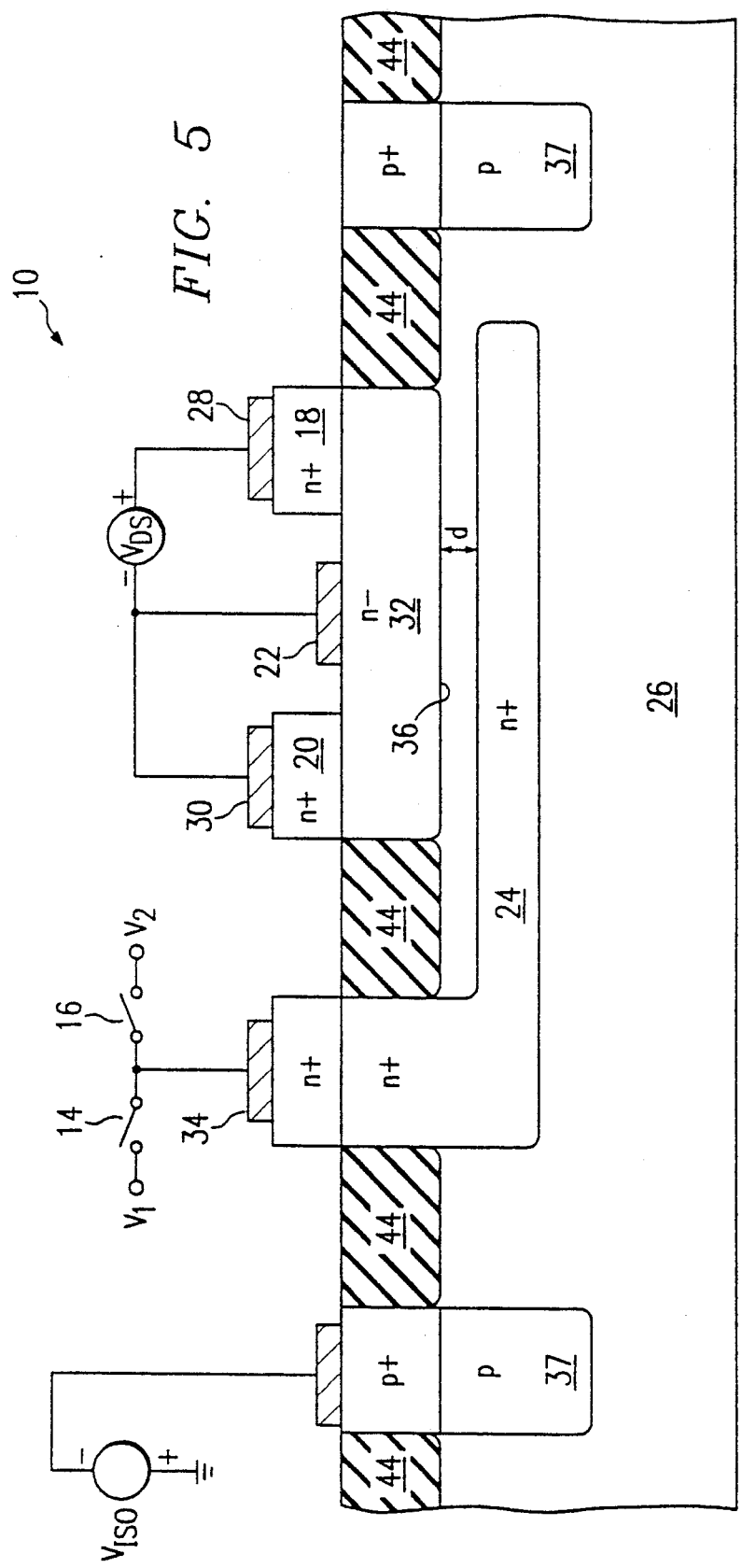
FIG. 5 is an elevational sectional view of a third preferred according to the invention.

FIG. 5 depicts an alternate embodiment having improved trap emptying capability. In this embodiment, drain region 18 and source region 20 are disposed in a layer vertically spaced from the layer in which channel area 32 is formed. Further, isolation region 37, channel area 32 and backgate 24 are now spaced from each other by regions 44 which are areas of substrate 26 intentionally damaged by implantation. In this configuration, the probability that electrons will tunnel towards source 20 and drain 18 rather than towards backgate 24 is reduced. Instead, a more constant tunneling of electrons across the length of the lower surface of channel area 32 is achieved. This effect allows for a reduction in the amount of power required to remove electrons from the traps. Regions 44 further improve the operation of resistor 10 by preventing the lateral transport of carriers between nearby regions which are doped by implantation. It is important to note that while an n channel device is depicted, the embodiment of FIG. 5 can also be implemented as a p channel device.

The embodiment depicted in FIG. 5 can be fabricated, for example, using epitaxial growth techniques. Layers of the required conductivity types may be successively formed by epitaxial growth followed by one or more compensating implants to create isolation region 37 and one or more implants to create the horizontal and vertical portions of backgate region 24. An etch is performed to define the boundaries of drain region 18, source region 20 and the vertical extension of backgate 24. Areas 44 may be created by selectively damaging the lattice of substrate 26 by implantation after annealing the regions which have been doped by implantation.

The present invention has a primary advantage in that it can be implemented with any semiconductor device having a current path which can be controlled by the trapping of charge along an interface similar to the one described above. Both silicon and gallium-arsenide technologies may be used depending on the required operating characteristics, such that the programmable resistive element 10 will be compatible with the associated system circuitry. Further, minimal chip area is required for the fabrication of such devices due to the simplicity of their structures; the need for up-down counters and a large number of associated resistors has been eliminated. By selectively controlling the number of electrons residing in the traps, the resistance can be varied over a wide-range of values.

What is claimed is:

1. A programmable resistor, comprising:
   a substrate formed of a layer of semiconductor of a first type;
   a current path region of a second type formed in said substrate wherein an interface having interfacial traps is formed between said current path and said substrate;
   a backgate formed adjacent said current path; and
   circuitry coupled to said backgate for varying the number of carriers residing in said interfacial traps.

2. The programmable resistor of claim 1, wherein said current path comprises a channel area of a field effect transistor.

3. The programmable resistor of claim 2, wherein said field effect transistor comprises a metal semiconductor field effect transistor.

4. The programmable resistor of claim 2, wherein said field effect transistor comprises a metal oxide semiconductor field effect transistor.

5. A programmable resistor, comprising:
   a field effect transistor including a channel area formed in a layer of semiconductor so as to create a plurality of interfacial traps along an interface between the channel and the layer of semiconductor;
   a backgate spaced from said channel area operable to vary the resistance of the channel area responsive to a voltage applied thereto;
   a first switch selectively coupling said backgate to a first voltage source; and
   a second switch selectively coupling said backgate to a second voltage source.

6. The programmable resistor of claim 5, wherein said layer of semiconductor is of a first type and said channel area is of a second type formed therein.

7. The programmable resistor of claim 5, wherein said first switch couples said backgate to a positive voltage and said second switch couples said backgate to a negative voltage.

8. The programmable resistor of claim 5, wherein said channel area is formed of N type gallium arsenide and said layer of semiconductor is formed of semi-insulating gallium arsenide.

9. The programmable resistor of claim 5, wherein said channel area is formed of N type silicon and said layer of semiconductor is formed of P type silicon.

10. The programmable resistor of claim 5, wherein said channel is formed of P type silicon and said layer of semiconductor is formed of N type silicon.

11. The programmable resistor of claim 5, wherein said channel area is formed of P type gallium arsenide and said layer of semiconductor is formed of semi-insulating gallium arsenide.

12. A programmable resistor, comprising:
   a field effect transistor formed in a semiconductor substrate of a first type conductivity comprising:
      a source region of a second conductivity type formed in said substrate;
      a drain region of said second conductivity type formed adjacent said substrate;
      a channel area of said second conductivity type formed adjacent said substrate, such that an interface having interfacial traps with said substrate is formed therebetween; and
a gate formed adjacent to said channel area;
a backgate spaced from said channel area and formed adjacent said substrate to be of said second conductivity type such that the resistance of the channel area can be varied responsive to a voltage applied to the backgate;
a first switch selectively connecting said backgate to a first voltage; and
a second switch selectively connecting said backgate to a second voltage.

13. The programmable resistor of claim 12, wherein said gate comprises a Schottky barrier gate.

14. The programmable resistor of claim 12, wherein said gate is separated from said channel area by a layer of insulator.

15. The programmable resistor of claim 12, wherein said source and drain regions and said backgate comprise heavily doped diffused regions of said second conductivity type and said channel area comprises a lightly doped diffused region of said second conductivity type.

16. The programmable resistor of claim 15, wherein said source and drain regions and said backgate comprise n+regions and said channel area comprises an n−area.

17. The programmable resistor of claim 12 and further comprising an isolation region formed in said layer of semiconductor and laterally enclosing at least said field effect transistor and said backgate.

18. The programmable resistor of claim 17 wherein said isolation region comprises an electrically biased conductive region.

19. The programmable resistor of claim 17 and further comprising a thick insulator layer overlying said isolation region.

20. The programmable resistor of claim 19 wherein said thick insulator layer comprises a layer of thick oxide.

21. A neural network array comprising:
a plurality of input lines;
a plurality of output lines;
a plurality of programmable resistors coupling each of said input lines with each of said output lines, said programmable resistors comprising:
a substrate formed of a layer of semiconductor of a first type;
a current path region of a second type formed in said substrate wherein an interface having interfacial traps is formed between said current path and said substrate;
a backgate formed adjacent said current path; and
circuitry coupled to said backgate for varying the number of carriers residing in said interfacial traps.

22. A method for providing a variable resistance element in a semiconductor substrate, comprising the steps of:
generating a current flow through a doped region of a first conductivity type having an interface with a substrate of a second conductivity type;
increasing the resistance of the doped region by filling the traps with electrons; and
decreasing the resistance of the current path by removing electrons from the traps.

23. The method of claim 21, wherein said step of increasing the resistance of the current path comprises the step of applying a voltage to a backgate formed in the substrate spaced from the doped region such that the barrier height between the traps and the backgate is reduced.

24. The method of claim 21, wherein said step of decreasing the resistance of the current path comprises the step of applying a voltage to the backgate such that the barrier width between the traps and the backgate is reduced wherein electrons are removed.

25. The method of claim 21, wherein said step of generating a current flow comprises the steps of creating a voltage difference between the source and the drain of a field effect transistor and applying a voltage to the gate of the field effect transistor to control the conductivity of the channel area.

26. A method for forming a programmable resistor at a face of a layer of semiconductor of a first conductivity type, comprising the steps of:
forming a horizontal portion of a backgate of a second conductivity type by an implant into the face of the layer of semiconductor;
forming a vertical portion of the backgate continuous with the horizontal portion by an implant into the face of the layer of semiconductor; and
forming source and drain regions of the second conductivity type spaced by a channel area of the second conductivity type.

27. The method of claim 26 and further comprising the step of implanting an isolation region laterally enclosing the source drain, the backgate and the channel area.

28. The method of claim 26 and further comprising the step of forming a layer of thick insulator overlying the isolation region.

29. A method for forming a programmable resistor at a face of a layer of semiconductor of a first conductivity type, comprising the steps of:
forming a horizontal portion of a backgate of a second conductivity type by epitaxial growth;
forming a second layer of semiconductor of the first conductivity type adjacent the horizontal portion of the backgate;
forming a vertical portion of the backgate continuous with the horizontal portion by at least one implant into the face of the second layer of semiconductor; and
forming source and drain regions of the second conductivity type spaced by a channel area of the second conductivity type, the source, drain and channel area formed by at least one implant into the face of the second layer of semiconductor.

30. A method for forming a programmable resistor at a face of a layer of semiconductor of a first conductivity type, comprising the steps of:
forming a horizontal portion of a backgate of a second conductivity type by epitaxial growth;
forming a second layer of semiconductor of the first conductivity type adjacent the horizontal portion of the backgate;
forming a vertical portion of the backgate continuous with the horizontal portion of the backgate by implantation and a channel area of the second conductivity type by epitaxial growth of semiconductor of the second conductivity type;

forming a top layer of semiconductor of the second conductivity type vertically adjacent the channel area by epitaxial growth; and defining the boundaries of a source region, a drain region and a vertical extension of the backgate, each vertically spaced from the channel area, by an etch of the top layer of semiconductor.

31. The method of claim 30 and further comprising the steps of:

performing at least one compensating implant into the face of the top layer of semiconductor to form an isolation region of the first conductivity type, the isolation region enclosing the channel area and the horizontal portion of the backgate; and selectively creating isolation regions between the channel area, the vertical portion of the backgate by selectively damaging the lattice of the semiconductor therebetween by implantation.

* * * * *